(12) United States Patent
Zapotylok et al.

(10) Patent No.: US 11,531,605 B2
(45) Date of Patent: Dec. 20, 2022

(54) MEMORY SYSTEM FOR HANDLING PROGRAM ERROR AND METHOD THEREOF

(71) Applicant: SK hynix Inc., Gyeonggi-do (KR)

(72) Inventors: Alexander Zapotylok, Minsk (BY); Sergei Peniaz, Minsk (BY)

(73) Assignee: SK hynix Inc., Gyeonggi-do (KR)

( * ) Notice: Subject to any disclaimer, the term of this patent is extended or adjusted under 35 U.S.C. 154(b) by 532 days.

(21) Appl. No.: 16/677,290

(22) Filed: Nov. 7, 2019

(65) Prior Publication Data

US 2020/0142793 A1 May 7, 2020

Related U.S. Application Data

(60) Provisional application No. 62/756,950, filed on Nov. 7, 2018.

(51) Int. Cl.
*G06F 11/20* (2006.01)
*G06F 3/06* (2006.01)

(52) U.S. Cl.
CPC ........ *G06F 11/2094* (2013.01); *G06F 3/0619* (2013.01); *G06F 3/0653* (2013.01); *G06F 3/0656* (2013.01); *G06F 3/0659* (2013.01); *G06F 3/0679* (2013.01); *G06F 2201/82* (2013.01)

(58) Field of Classification Search
CPC .. G06F 11/2094; G06F 3/0653; G06F 3/0656; G06F 3/0659; G06F 3/0679; G06F 11/1068; G06F 11/1076; G06F 11/1456; G06F 11/3034; G06F 11/1048; G06F 11/1441; G06F 11/1451; G06F 11/3409; G06F 11/14; G06F 11/2087; G06F 11/2071; G06F 11/2015; G06F 11/2082
See application file for complete search history.

(56) References Cited

U.S. PATENT DOCUMENTS

| | | | |
|---|---|---|---|
| 10,019,332 B1 | 7/2018 | Sehgal et al. | |
| 10,579,264 B2* | 3/2020 | Lee | G06F 3/0604 |
| 10,678,633 B2* | 6/2020 | Kim | H03M 13/09 |
| 10,706,936 B1* | 7/2020 | Sehgal | G06F 3/0659 |
| 10,761,953 B2* | 9/2020 | Seo | G06F 11/2094 |
| 10,860,421 B2* | 12/2020 | Kim | G06F 3/0679 |
| 10,997,039 B2* | 5/2021 | Koo | G06F 12/0246 |
| 11,182,242 B2* | 11/2021 | Chauhan | G06F 11/0793 |
| 11,204,846 B2* | 12/2021 | Seo | G06F 11/2094 |
| 2012/0124304 A1 | 5/2012 | Asnaashari et al. | |
| 2014/0215129 A1* | 7/2014 | Kuzmin | G06F 12/0246 711/103 |
| 2015/0124525 A1* | 5/2015 | Kim | G11C 16/10 365/185.11 |

(Continued)

*Primary Examiner* — Kamini B Patel
(74) *Attorney, Agent, or Firm* — IP & T Group LLP

(57) ABSTRACT

A scheme for handling program errors is provided for a memory system which includes a memory device and a controller including firmware and a memory interface. The firmware issues commands for program operations to the memory interface. After detecting a failed program operation in a particular memory block, the firmware reroutes that program operation to a different location in a different memory block and takes further action to reduce the likelihood of a subsequent error occurring in the same memory block in which the failed program operation occurred.

18 Claims, 8 Drawing Sheets

(56) References Cited

U.S. PATENT DOCUMENTS

| | | | | |
|---|---|---|---|---|
| 2016/0259570 A1* | 9/2016 | Agarwal | ................ | G11C 29/08 |
| 2017/0060470 A1* | 3/2017 | Jung | ................... | G06F 13/4234 |
| 2017/0177242 A1* | 6/2017 | Park | ....................... | G06F 12/08 |
| 2017/0192719 A1* | 7/2017 | Park | ...................... | G06F 3/0679 |
| 2018/0039447 A1* | 2/2018 | Lee | .................... | G06F 11/1064 |
| 2018/0217754 A1* | 8/2018 | Lee | ....................... | G06F 3/0685 |
| 2018/0341557 A1* | 11/2018 | Koo | ....................... | G06F 3/0619 |
| 2019/0114239 A1* | 4/2019 | Seo | ....................... | G06F 3/0679 |
| 2019/0163563 A1* | 5/2019 | Kim | .................... | G06F 11/1048 |
| 2020/0026464 A1* | 1/2020 | Yen | .................... | G06F 12/1009 |
| 2020/0026649 A1* | 1/2020 | Lee | .................... | G06F 11/1048 |
| 2020/0264948 A1* | 8/2020 | Kim | ..................... | H03M 13/09 |
| 2020/0371885 A1* | 11/2020 | Seo | ....................... | G06F 3/0679 |
| 2022/0114054 A1* | 4/2022 | Kim | ................... | G06F 11/1415 |

\* cited by examiner

MEMORY SYSTEM FOR HANDLING PROGRAM ERROR AND METHOD THEREOF

CROSS-REFERENCE TO RELATED APPLICATION

This application claims the benefit of U.S. Provisional Application No. 62/756,950, filed on Nov. 7, 2018, the entire contents of which are incorporated herein by reference.

BACKGROUND

1. Field

Embodiments of the present disclosure relate to a program error handling scheme for a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces such as a universal flash storage (UFS), and solid state drives (SSDs).

In memory systems, various errors such as program error may occur. In this context, embodiments of the invention arise.

SUMMARY

Aspects of the present invention are directed to a scheme for handling program error in a memory system.

In one aspect, a memory system includes a memory device including a plurality of blocks; and a controller including firmware and a memory interface coupled to the plurality of blocks. The firmware issues commands to the memory interface for program operations, such that the memory interface stores the commands including a first command for a first program operation and a second command for a second program operation and controls the memory device to sequentially perform the first and second program operations in response to the stored commands. The firmware detects whether the first program operation performed on a first location of a selected block among the plurality of blocks failed. When it is detected that the first program operation failed, the firmware controls the memory interface to reroute the first program operation to a second location in a block other than the selected block among the plurality of blocks and cancel the second program operation.

In another aspect, a method for operating a controller including firmware and a memory interface coupled to a plurality of blocks in a memory device is provided. The method includes: issuing, by the firmware to the memory interface, commands for program operations, the commands including a first command for a first program operation and a second command for a second program operation, such that the memory interface stores the commands and controls the memory device to sequentially perform the first and second program operations in response to the stored commands; detecting, by the firmware, whether the first program operation performed on a first location of a selected block among the plurality of blocks failed; and controlling, by the firmware, the memory interface to reroute the first program operation to a second location in a block other than the selected block among the plurality of blocks and cancel the second program operation when it is detected that the first program operation failed.

Additional aspects of the present invention will become apparent from the following description.

DETAILED DESCRIPTION

Figure 1:
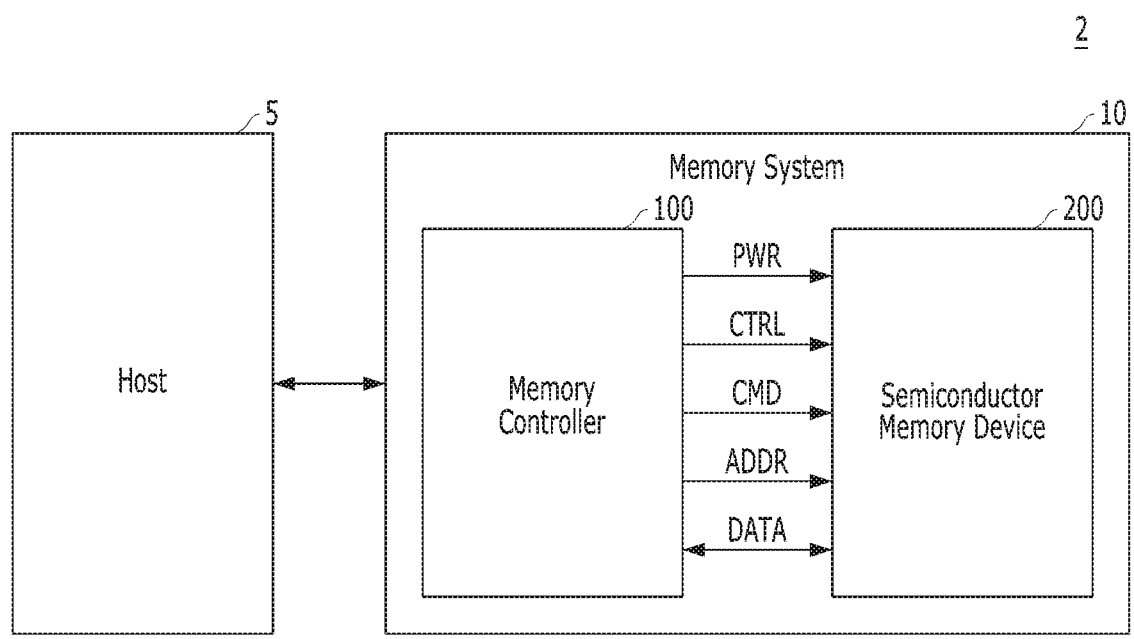
FIG. 1 is a block diagram illustrating a data processing system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram illustrating a data processing system 2 in accordance with an embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any one of various kinds of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any one of various kinds of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operations of the semiconductor memory device 200. For simplicity, memory controller 100 and semiconductor memory device 200 may sometimes be referred to below as controller 100 and memory device 200, respectively.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
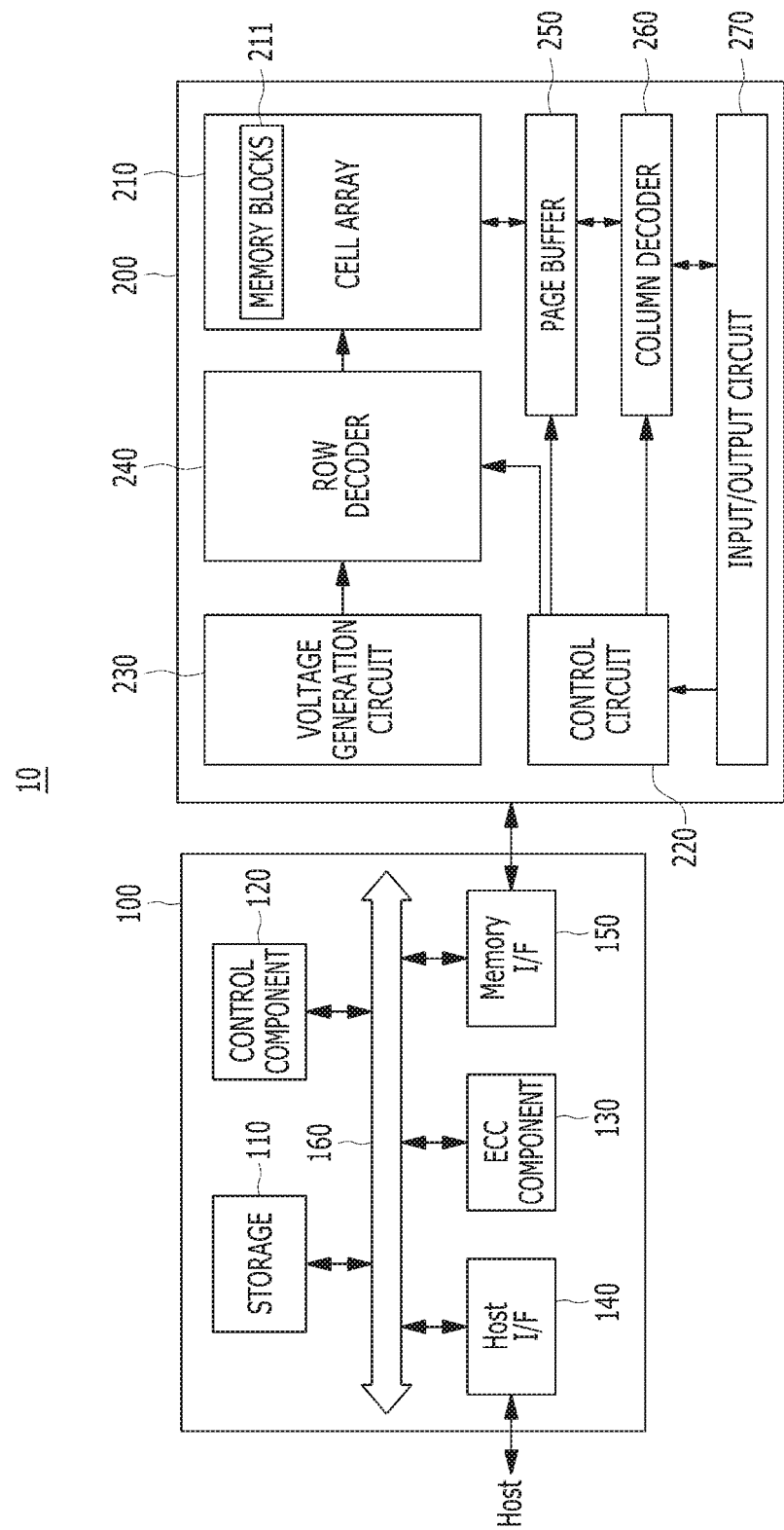
FIG. 2 is a block diagram illustrating a memory system in accordance with an embodiment of the present invention.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), an integrated drive electronics (IDE), a non-volatile memory express (NVMe) and a universal flash storage (UFS).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
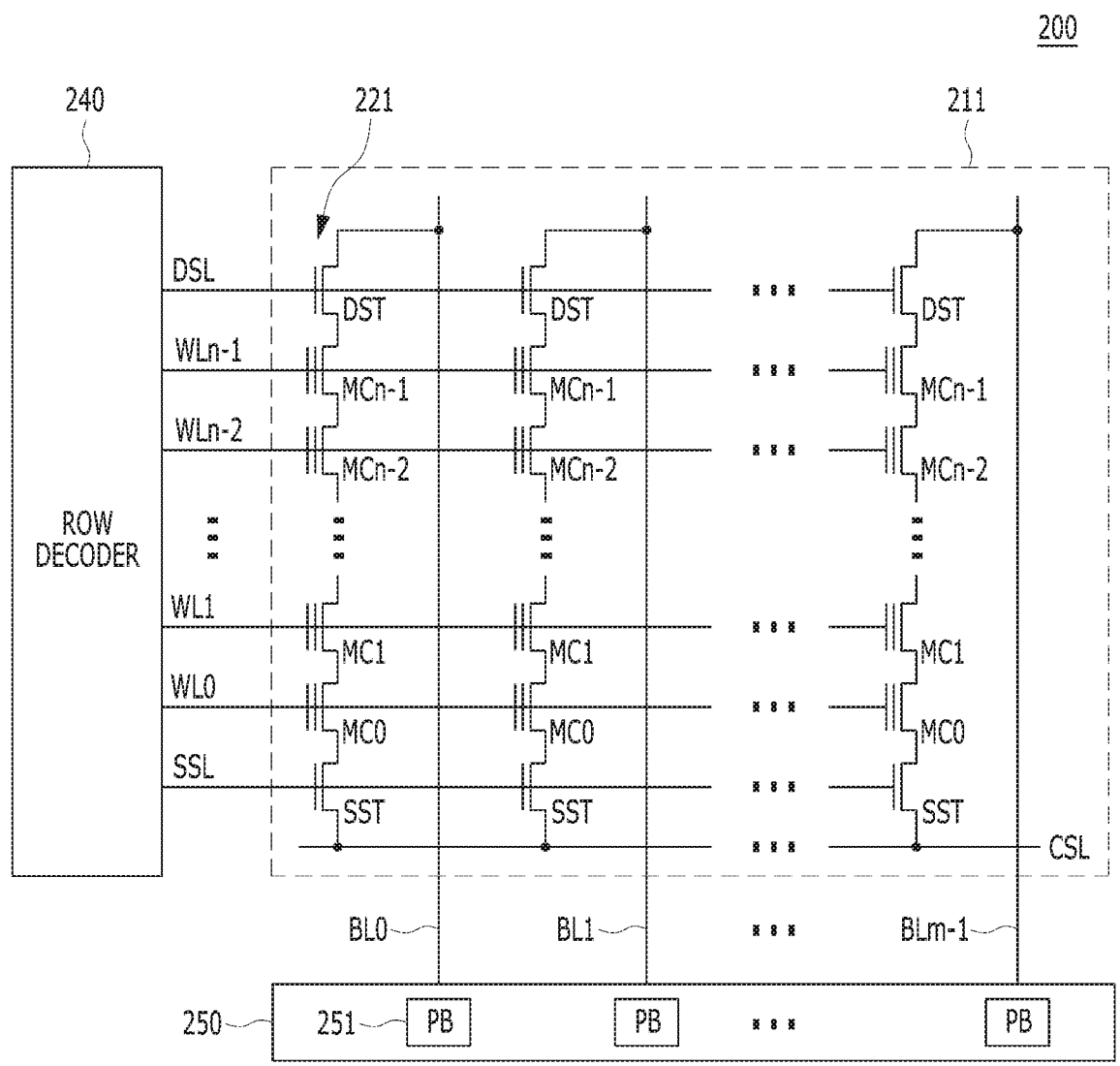
FIG. 3 is a circuit diagram illustrating a memory block of a memory device in accordance with an embodiment of the present invention.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn−1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as a multiple level cell. For example, each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm-1. The page buffers 251 may operate in response to page buffer control signals. For example, the page buffers 251 my temporarily store data received through the bit lines BL0 to BLm-1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

A memory device such as a flash memory (e.g., NAND flash memory) may include a plurality of memory blocks (e.g., hundreds to thousands of memory blocks). Each block typically may include a plurality of wordlines (e.g., hundreds of wordlines). Each cell coupled to each wordline may include multiple logical pages. The memory device may include a plurality of memory cells and store multiple bits per cell by modulating the cell into different states or program voltage (PV) levels through a programming operation.

Figure 4:
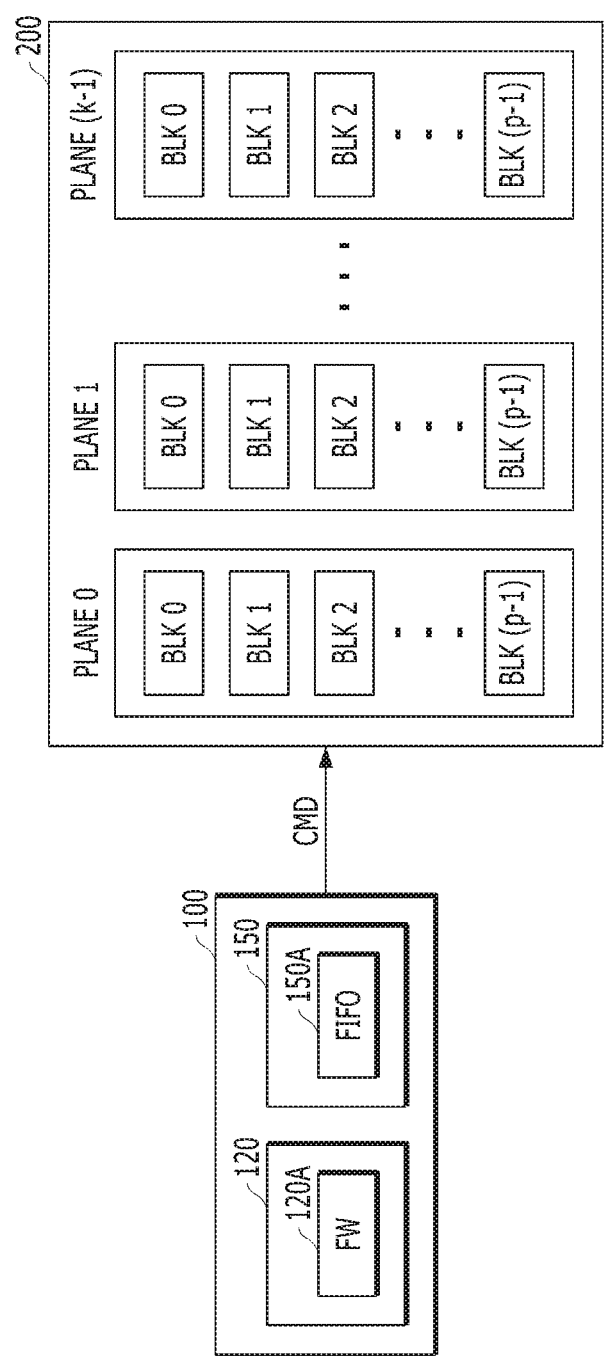
FIG. 4 is a diagram illustrating a memory system in accordance with an embodiment of the present invention.

FIG. 4 is a diagram illustrating a memory system in accordance with an embodiment of the present invention.

Referring to FIG. 4, the memory system may include a controller 100 and a memory device 200. The memory device 200 may include a plurality of planes PLANE0 to PLANE(k-1). Each of the plurality of planes may include a plurality of blocks BLK0 to BLK(p-1). Each of the plurality of blocks includes a plurality of pages. Each of the plurality of pages may have a physical address.

The controller 100 may include a control component 120 and a memory interface 150. The control component 120 may include firmware (FW) 120A. In some embodiments, the firmware 120A may include a host interface layer (HIL), a flash translation layer (FTL) and a flash interface layer (FIL).

The host interface layer may control an operation of the host interface 140 in FIG. 2. For example, the host interface layer may receive from the host 5 commands (e.g., commands for program, read and erase operations), data and/or logical addresses (LBAs), which are associated with operations to be performed and associated locations in the memory device 200. Further, the host interface layer may forward the commands, data and/or addresses to the flash translation layer.

The flash translation layer may control an operation of the control component 120 in FIG. 2. For example, the flash translation layer may receive logical addresses from the host interface layer and translate the logical addresses into physical addresses. Further, the flash translation layer may receive commands from the host interface layer and translate the commands into operation commands. Furthermore, the flash translation layer may receive data from the host interface layer and provide the data to the flash interface layer.

The flash interface layer may control an operation of the memory interface 150 in FIG. 2. For example, the flash interface layer may receive data, physical addresses and operation commands from the flash translation layer and transmit the data, the physical addresses and the operation commands to the memory interface 150.

The memory interface 150 may include a first-in first-out (FIFO) buffer 150A. The memory interface 150 may receive data, physical addresses and operation commands from the controller 120. The memory interface 150 may store the operation commands in the FIFO buffer 150A according to a FIFO scheme. Further, the memory interface 150 may output the stored operation commands CMDs to the memory device 200 according to the FIFO scheme. In other words, the memory interface 150 may control the memory device 200 to perform an operation (e.g., a program, read or erase operation) on at least one block in the memory device 200.

In some embodiments, the memory interface 150 may handle an operation command based on a deferred (or an asynchronous) command execution method. In accordance with the deferred command execution method, the firmware 120A may issue (or submit) commands for program operations to the memory interface 150 irrespective of when or in what order the commands will be executed and their corresponding operations completed. The firmware 120A may not handle command timings, data transfer and status checks. Further, the firmware 120A may not have any indication of the current status a certain command. Thus, the number of back-to-back program errors that occur on the same memory block may increase, as may the amount of reserved hardware resources in the memory interface 150 for processing such errors. Accordingly, it is desirable to provide a scheme for handling program errors to reduce or minimize the number of program errors on a failed memory block and the amount of reserved resources for handling program errors.

Figure 5:
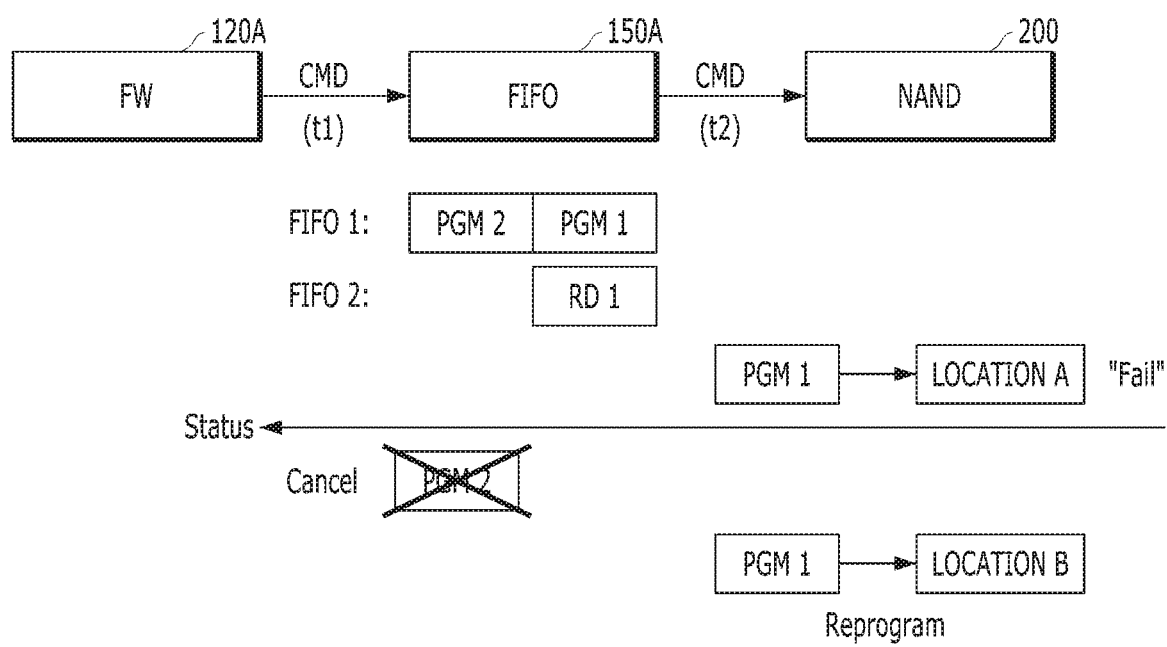
FIG. 5 is a diagram illustrating an operation of a memory system in accordance with an embodiment of the present invention.

FIG. 5 is a diagram illustrating an operation of a memory system in accordance with an embodiment of the present invention.

Referring to FIG. 5, the memory system may include a controller and a memory device 200. The controller may include firmware (FW) 120A of the control component 120 and a FIFO buffer 150A of the memory interface 150 as shown in FIG. 1. In some embodiments, when the memory device 200 is implemented with a flash memory (e.g., a NAND flash memory), the memory interface 150 may function as a flash controller.

The firmware 120A may issue commands CMD for operations to the FIFO buffer 150A of the memory interface 150. By way of example and not limitation, the commands may include a first program command PGM1 for a first program operation and a second program command PGM2 for a second program operation. The first program operation may be performed on a first location (LOCATION A) (e.g., a page) of a selected block among a plurality of blocks in the memory device 200. The second program operation may be set to be performed on a subsequent location next to the first location in the selected block. Further, the commands may include a first read command RD1 corresponding to the first program command PGM1.

The memory interface 150 may receive issued commands from the firmware 120A and store the received commands in the FIFO buffer 150A. By way of example and not limitation, the memory interface 150 may receive and store the first program command PGM1, the second program command PGM2 and the first read command RD1 in the FIFO buffer 150A. In some embodiments, the FIFO buffer 150A may include FIFOs corresponding to priorities of commands. For example, the FIFO buffer 150A may include a FIFO for storing low priority commands (e.g., program or erase commands) and a FIFO for storing high priority commands (e.g., read commands). In other words, the FIFO buffer 150A may include a first FIFO (FIFO1) for storing program commands PGM1, PGM2 and a second FIFO (FIFO2) for storing read command RD1. The FIFO buffer 150A may output the stored commands therein to the memory device 200 such that operations corresponding to the stored commands are sequentially performed.

The FIFO buffer 150A may output commands based on a deferred (or an asynchronous) command execution method. In other words, the FIFO buffer 150A may issue a command stored therein to the memory device 200 at a time t2 whereas the firmware 120A may issue a command to the FIFO buffer 150A at a time t1 different from the time t2.

In some embodiments, the firmware 120A may detect whether the first program operation on the first location of the selected block fails, in response to a status signal from the memory device 200. When it is detected that the first program operation failed, the firmware 120A may control the FIFO buffer 150A to reroute the first program operation to a second location (LOCATION B) different from the first location (LOCATION A). For example, the second location may be in a block other than the block of the first location. Thus, the block of the second location may be selected from remaining blocks among the plurality of blocks in the memory device 200. Thus, data for the first program operation PGM1 may be reprogrammed.

In some embodiments, the firmware 120A may cancel all issued program commands for program operations on the failed memory block. When the first program operation on a selected memory block falls and the second program operation is to be performed on that same memory block, the firmware 120A may cancel the second program operation. Thus, by canceling a program operation that may cause another program error in the same block (i.e., back-to-back program errors), the firmware 120A may reduce recovery time and hardware resources to be reserved for handling program errors.

Further, the firmware 120A may reroute read operations on the failed memory block to another memory block such that data integrity associated with the read operations may be maintained and corresponding read data may not be lost. For example, the firmware 120A may reroute a read operation on the first location (LOCATION A) of the failed memory block to the second location (LOCATION B). The second location (LOCATION B) may be the same location to which the first program operation is rerouted.

Figure 6:
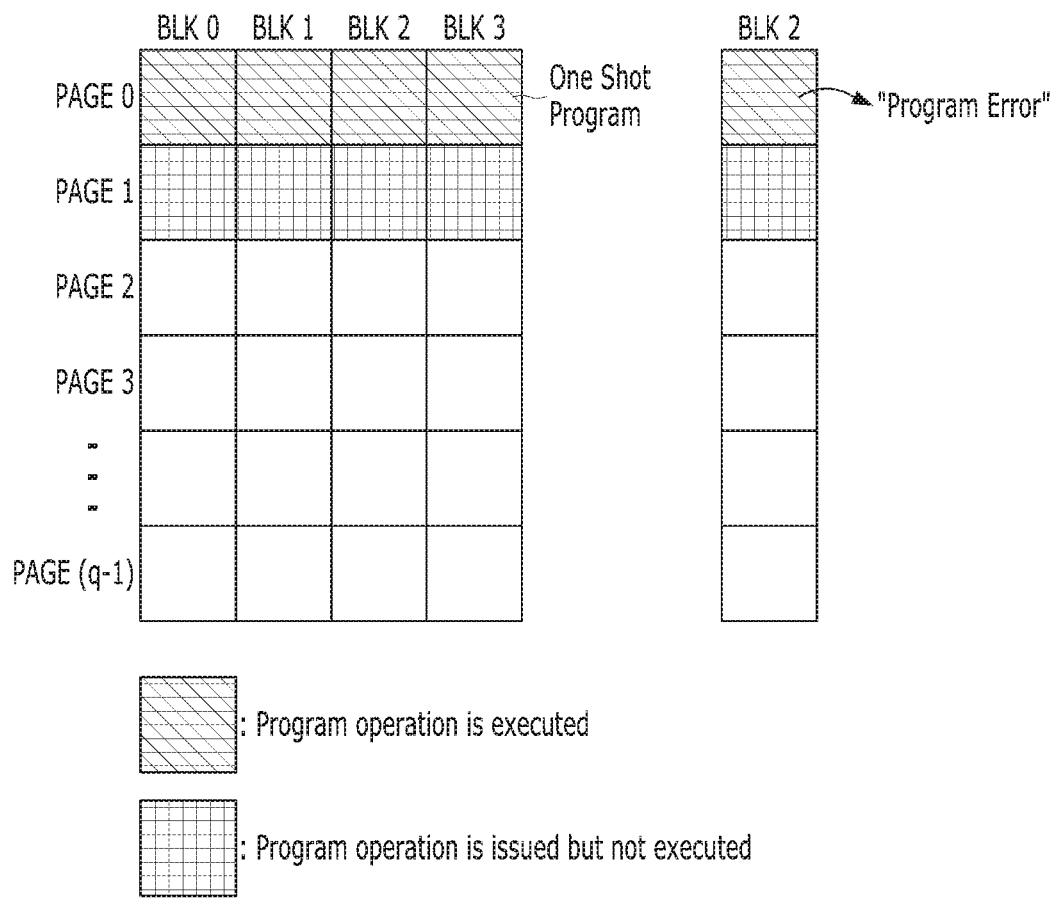
FIG. 6 is a diagram illustrating a super block layout in accordance with an embodiment of the present invention.

FIG. 6 is a diagram illustrating a super block layout of a memory device in accordance with an embodiment of the present invention.

Referring to FIG. 6, the memory device may include a plurality of memory blocks BLK0 to BLK3. Each of the memory blocks BLK0 to BLK3 may include a plurality of pages PAGE0 to PAGE(q-1). The memory blocks BLK0 to BLK3 may be programmed by the memory interface 150 of FIGS. 4 and 5.

In some embodiments, the memory interface 150 may configure the memory blocks BLK0 to BLK3 as a super block and perform a program operation on the super block. When the firmware 120A asynchronously issues commands for program operations on the super block, the FIFO buffer 150A of the memory interface 150 may receive and store a first program command for a one-shot program operation on pages PAGE0 of the super block and a second program command for a one-shot program operation on pages PAGE1 of the super block. The FIFO buffer 150A may sequentially issue the first program command and the second program command to the memory device 200. First, a one-shot programming may be executed on the pages PAGE0 of the memory blocks BLK0 to BLK3. When the memory device 200 performs the program operation on the page PAGE0 of the memory block BLK2, a program error may occur. At this time, a one-shot program operation on pages PAGE1 of the memory blocks BLK0 to BLK3 may be issued but not executed yet. Thus, the memory block BLK2 may include a page with a program error, a program pending page (i.e., program operation is issued but not executed yet) and remaining pages. In some embodiments, the remaining pages may need to be excluded from calculating a valid page count, which is explained below.

Figure 7:
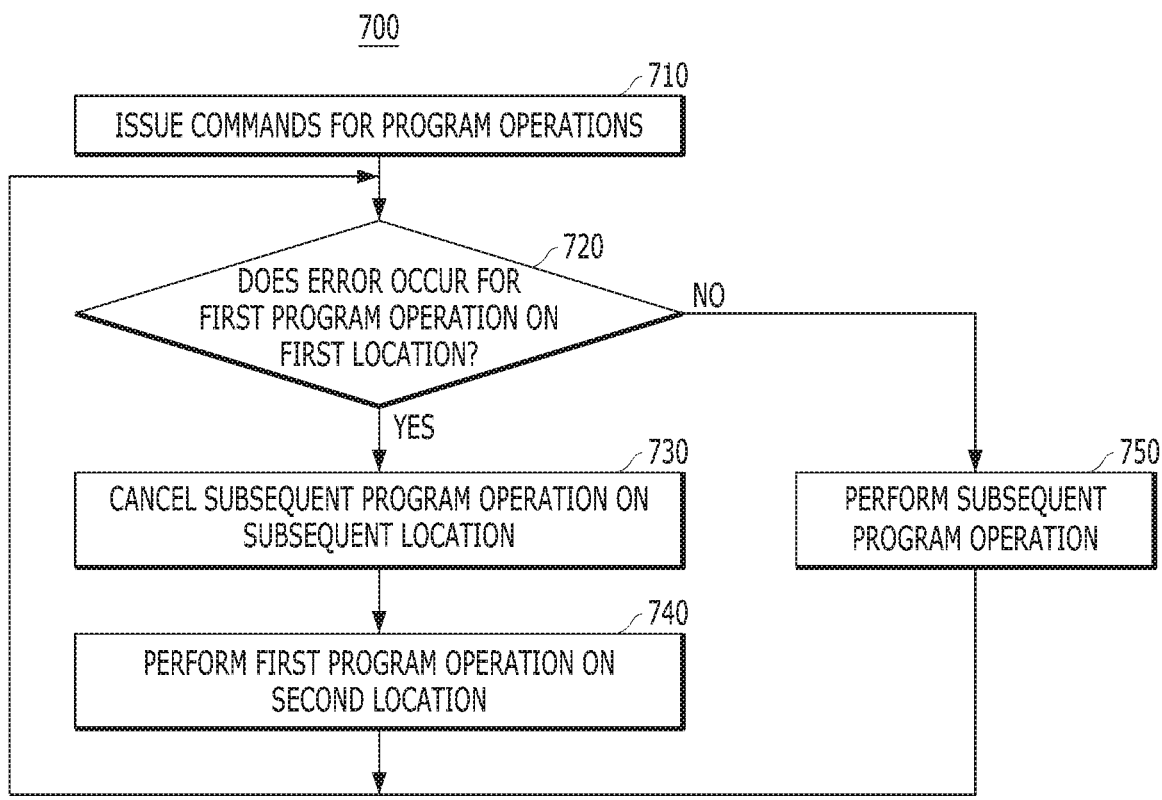
FIG. 7 is a flowchart illustrating an operation of a memory system in accordance with an embodiment of the present invention.

FIG. 7 is a flowchart illustrating an operation 700 of a memory system in accordance with an embodiment of the present invention. The operation 700 may be performed by the firmware 120A of FIGS. 4 and 5.

Referring to FIG. 7, at step 710, the firmware 120A may issue commands for program operations to the FIFO buffer 150A of the memory interface 150. The commands may include a first command for a first program operation and a second command for a second program operation. The memory interface 150 may store the commands and control the memory device 200 to sequentially perform the first and second program operations in response to the stored commands. In some embodiments, the first program operation may be performed on a first location of a selected block among a plurality of blocks of the memory device 200, and the second program operation may be set to be performed on a subsequent location (with respect to the first location) of the selected block.

At step 720, the firmware 120A may detect whether the first program operation on the first location of the selected block failed. In other words, the firmware 120A may detect whether error occurred for the first program operation on the first location.

At step 730, when it is detected that the first program operation failed (YES in 720), the firmware 120A may control the memory interface 150 to reroute the first program operation to a second location in a different block than the block with the first location among the plurality of blocks. Further, the firmware 120A may control the memory interface 150 to cancel the second program operation as a subsequent program operation on the selected block.

As step 740, the firmware 120A may control the memory interface 150 to perform the first program operation on the second location.

As step 750, when the first program operation succeeded, i.e., failure not detected (NO in 720), the firmware 120A may perform the second program operation on the subsequent location of the selected block.

Figure 8:
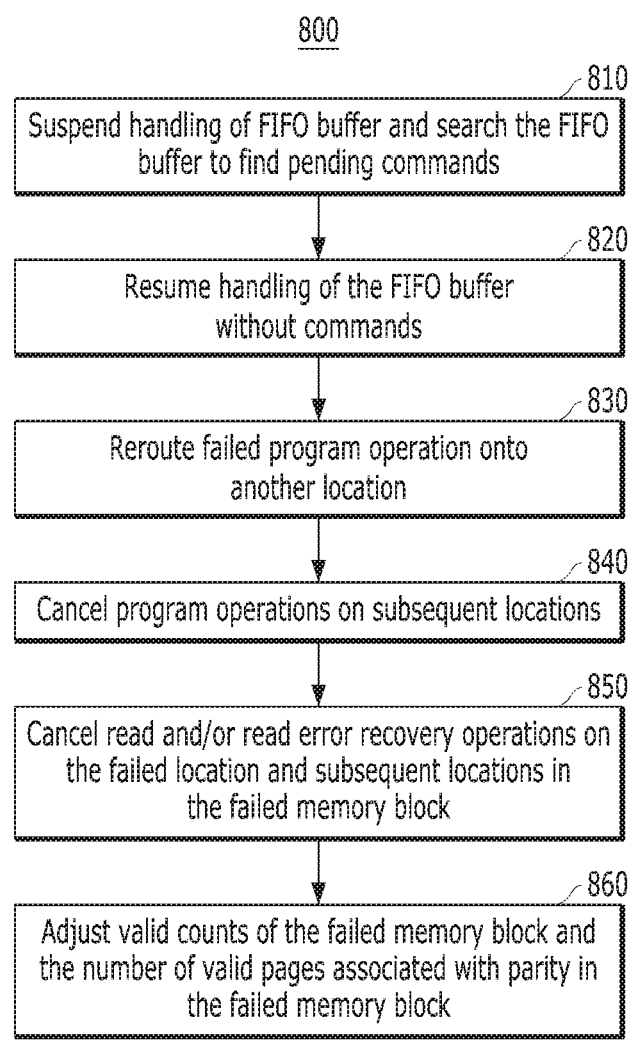
FIG. 8 is a flowchart illustrating an operation of a memory system in accordance with an embodiment of the present invention.

FIG. 8 is a flowchart illustrating an operation 800 for handling program error in a memory system in accordance with an embodiment of the present invention. The operation 800 may be performed when a first program operation on a first location (e.g., page) of a failed memory block in the memory device 200 fails. The operation 800 may be performed by the firmware 120A of FIGS. 4 and 5.

Referring to FIG. 8, at step 810, the firmware 120A may suspend handling of, i.e., flow of commands into and out of, the FIFO buffer 150A and search the FIFO buffer 150A to find pending commands, i.e., commands waiting for execution. Further, the firmware 120A may delete the pending commands in the FIFO buffer 150A and back up the pending commands in a separate data buffer. Thus, the FIFO buffer 150A no longer stores any commands.

At step 820, the firmware 120A may resume handling of the FIFO buffer 150A without commands. Further, the firmware 120A may issue a read command to a page buffer of the memory device 200 in order to extract user data. Furthermore, the firmware 120A may mark the failed memory block as defective in a mapping table such a flash translation layer (FTL) table.

At step 830, the firmware 120A may reroute the failed program operation to another location in a different memory block from the failed memory block. The different memory block may be any one of remaining memory blocks in the memory device 200. Further, the firmware 120A may restore all previously pending commands back to the FIFO buffer 150A, except program commands for operations on the failed memory block.

At step 840, the firmware 120A may cancel program operations on subsequent locations (e.g., pages or wordlines) in the failed memory block. The cancelling operation may be the result of not restoring program command(s) for operations on the failed memory block in the FIFO buffer 150A. Any such command remaining in the FIFO buffer 150A may be deleted, which would serve as the cancelling operation in that case.

At step 850, the firmware 120A may cancel read and/or read error recovery operations on the failed location and subsequent locations in the failed memory block. In other words, the firmware 120A may not restore (or delete) a corresponding command in the FIFO buffer 150A. Further, the firmware 120A may reroute the read operation(s) to the same location to where the failed program operation was redirected.

At step 860, the firmware 120A may adjust a valid count of the failed memory block. For example, when the program operation is performed on a super block in a one-shot programming scheme, the firmware 120A needs to decrease the super block size after adding program failure location to the defect mapping table. Valid count of the super block may be adjusted by the following equation (Equation 1):

MaxValidCountOfSuperBlock=(PhysicalBlockValidCount−(FailedWordLineNumber−OverlappingMetaDataAtTheEndOfSuperBlock)*ValidCountPerPhysicalPage)   (Equation 1)

In Equation 1, MaxValidCountOfSuperBlock represents a maximum valid count of a super block, PhysicalBlockValidCount represents a valid count of a physical block, FailedWordLineNumber represents the number of failed word lines in the super block, ValidCountPerPhysicalPage represents a valid count per physical page, and OverlappingMetaDataAtTheEndOfSuperBlock represents overlapping meta data at the end of a super block.

Further, the firmware 120A may adjust the number of valid pages associated with parity in the failed memory block. For example, the firmware 120A may adjust the number of valid pages for parity operations in progress by the number of canceled program operations in parity group. Program operations that need to be canceled were already counted in a mapping table (e.g., chipkill/parity map), thus the counter needs to be adjusted.

Furthermore, the firmware 120A may adjust queued/deferred parity group structures in the program failure that happened on parity location. The firmware 120A may not stop issuing (or submitting) program operations to another die in the super block while waiting for parity counters to match the number of XORed buffers. The firmware 120A may have a separate queue of outstanding (or queued) parity pages that need to be flushed. The firmware 120A may keep the parity pages along with the user page, thus when a program error occurs in one of those planes, its structure needs to be adjusted.

As described above, the embodiments provide a scheme for handling program errors in a memory system. The embodiments may reroute a program operation on a failed memory block to another location and cancel all pending program operations on the failed memory block. Thus, the number of program errors on the failed memory block and the amount of reserved resources for handling program errors may be reduced.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:

1. A memory system comprising:
   a memory device including a plurality of blocks; and
   a controller including firmware and a memory interface coupled to the plurality of blocks,
   wherein the firmware is suitable for:
   issuing commands to the memory interface for program operations, the commands including a first command for a first program operation and a second command for a second program operation, such that the memory interface stores the commands and controls the memory device to sequentially perform the first and second program operations in response to the stored commands;
   detecting whether the first program operation performed on a first location of a selected block among the plurality of blocks failed due to a number of error bits in data read from the selected block after programming exceeding a threshold level; and
   when it is detected that the first program operation failed, controlling the memory interface to reroute the first program operation to a second location in a block other than the selected block among the plurality of blocks and cancel the second program operation, and in response to detecting that the first program operation failed due to the number of error bits in data read from the selected block after programming, cancelling program operations on the selected block to avoid back-to-back program errors.

2. The memory system of claim 1, wherein the memory interface includes a first-in first-out (FIFO) buffer for storing and outputting the first and second commands in a FIFO scheme.

3. The memory system of claim 2, wherein the second program operation is set to be performed on a subsequent location next to the first location in the selected block.

4. The memory system of claim 3, wherein the firmware deletes the second command in the FIFO buffer to cancel the second program operation.

5. The memory system of claim 4, wherein the firmware backs up the second command in a data buffer.

6. The memory system of claim 5, wherein the firmware restores the second command from the data buffer to the FIFO buffer after the first program operation is performed on the second location.

7. The memory system of claim 4, wherein the firmware issues a read command to the memory interface to detect whether the first program operation failed.

8. The memory system of claim 7, wherein the firmware cancels a read operation and a read error recovery operation on the first location and controls the memory interface to perform a read operation on the second location.

9. The memory system of claim 4, wherein the firmware adjusts valid counts of the selected block and the number of valid pages associated with parity.

10. A method for operating a controller including firmware and a memory interface coupled to a plurality of blocks in a memory device, the method comprising:
issuing, by the firmware to the memory interface, commands for program operations, the commands including a first command for a first program operation and a second command for a second program operation, such that the memory interface stores the commands and controls the memory device to sequentially perform the first and second program operations in response to the stored commands;
detecting, by the firmware, whether the first program operation performed on a first location of a selected block among the plurality of blocks failed due to a number of error bits in data read from the selected block after programming exceeding a threshold level;
controlling, by the firmware, the memory interface to reroute the first program operation to a second location in a block other than the selected block among the plurality of blocks and cancel the second program operation when it is detected that the first program operation failed, and
in response to detecting that the first program operation failed due to the number of error bits in data read from the selected block after programming, cancelling program operations on the selected block to avoid back-to-back program errors.

11. The method of claim 10, wherein the memory interface includes a first-in first-out (FIFO) buffer for storing and outputting the first and second commands in a FIFO scheme.

12. The method of claim 11, wherein the second program operation is set to be performed on a subsequent location next to the first location in the selected block.

13. The method of claim 12, further comprising:
deleting the second command in the FIFO buffer to cancel the second program operation.

14. The method of claim 13, further comprising:
backing up the second command in a data buffer.

15. The method of claim 14, further comprising:
restoring the second command from the data buffer to the FIFO buffer after the first program operation is performed on the second location.

16. The method of claim 13, further comprising:
issuing a read command to the memory interface to detect whether the first program operation failed.

17. The method of claim 16, further comprising:
cancelling a read operation and a read error recovery operation on the first location; and
controlling the memory interface to perform a read operation on the second location.

18. The method of claim 13, further comprising:
adjusting valid counts of the selected block and the number of valid pages associated with parity.

* * * * *